United States Patent [19]

Svala

[11] 4,348,768
[45] Sep. 7, 1982

[54] PCM CODEC USING COMMON D/A CONVERTER FOR ENCODING AND DECODING

[75] Inventor: Carl G. Svala, Delaware, Ohio

[73] Assignee: International Telephone and Telegraph Corporation, New York, N.Y.

[21] Appl. No.: 69,374

[22] Filed: Aug. 24, 1979

Related U.S. Application Data

[63] Continuation of Ser. No. 830,779, Sep. 6, 1977, abandoned.

[51] Int. Cl.³ .............................................. H03K 13/02
[52] U.S. Cl. .................................. 375/26; 340/347 C; 340/347 M; 340/347 AD; 340/347 DA
[58] Field of Search ... 340/347 M, 347 AD, 347 DA, 340/347 C

[56] References Cited

U.S. PATENT DOCUMENTS

| | | | |
|---|---|---|---|
| 3,656,152 | 4/1972 | Gundersen | 340/347 DA |
| 3,879,724 | 4/1975 | McDonald | 340/347 NT X |
| 3,883,864 | 5/1975 | Thomas | 340/347 AD X |
| 3,893,102 | 7/1975 | Candy | 340/347 M X |
| 3,900,844 | 8/1975 | Wald | 340/347 AD X |
| 3,906,489 | 9/1975 | Schlichte | 340/347 DA |
| 3,984,829 | 10/1976 | Zwack | 340/347 DA X |
| 3,993,992 | 11/1976 | Zwack | 340/347 AD X |
| 4,056,820 | 11/1977 | Hofer | 340/347 AD X |
| 4,151,518 | 4/1979 | Jansson et al. | 340/347 DA X |
| 4,160,243 | 7/1979 | Moriya et al. | 340/347 DA X |

OTHER PUBLICATIONS

Apon et al., Comcon, An Educational Project-, Paper presented at ISS 1974 in 9/74.

Primary Examiner—Thomas J. Sloyan
Attorney, Agent, or Firm—James B. Raden; Donald J. Lenkszus

[57] ABSTRACT

A codec (coder/decoder), having particular utility in a pulse code modulation (PCM) communications system employing per-line coding and decoding, employs a common digital-to-analog (DAC) converter. A PCM signal to be reconstructed is decoded at two points of time within the basic sampling interval, preferably at twice the basic sampling frequency. In order to realize the desired analog reconstruction level, the PCM signal is first decoded at a first decision level lying on one side of the desired reconstruction level; then modified and again decoded at a different decision level lying on the other side of the desired reconstruction level. The average of the two decoded analog signals then lies on the desired reconstruction level. In a conventional PCM system, the two PCM samples differ by only one least significant bit (LSB) in the PCM word used in setting the common DAC. In a preferred embodiment of the invention, separate storage registers are respectively employed for the encoding and decoding, together with a selector for switching between the two registers during the two desired decoding intervals. In this way, the encoding operation may be carried on during a substantial portion of the basic sampling cycle, being interrupted only for generation of decoded samples. The invention is applicable to PCM systems generally, including compressed pulse code modulation (CPCM) systems operating in accordance with the U-law or the A-law.

18 Claims, 3 Drawing Figures

PCM CODEC USING COMMON D/A CONVERTER FOR ENCODING AND DECODING

This is a continuation of application Ser. No. 830,779 filed Sep. 6, 1977, now abandoned.

BACKGROUND OF THE INVENTION

My invention relates to codecs (coder-decoders), primarily intended for encoding and decoding of analog signals, e.g., speech of similar signals, in Pulse Code Modulation (PCM) systems, and is particularly applicable to so-called per-line codecs which are not time-shared by several PCM channels.

A particular and commonly-used category of such codecs relies on so-called digital-to-analog converters (DAC's) for encoding and decoding. The DAC usually comprises a resistor network in combination with a number of electronic switches which are set by the digital code to be converted. The analog output signal from the combination network will then be related to a reference input signal according to the setting of the switches and the desired transfer characteristic. This reference signal is usually a fixed voltage of selectable polarity.

In order to accommodate great variations in the signal levels to be encoded, while yet maintaining an acceptable signal-to-quantization-noise ratio, compressed pulse code modulation (CPCM) employing companding is customarily used. This may follow one of the companding laws accepted as standard in the communications industry, e.g., the so-called Mu-Law or the so-called A-Law. As is well-known, companding requires a nonlinear transfer characteristic between the input signal and the resulting CPCM code. An inverse transfer characteristic is applied in the decoding process in order to provide an overall transfer charactertistic that is linear after the speech signal has been both coded and decoded. This requirement can be met, at least approximately, by using identical DAC's for both encoding and decoding. Since the DAC is one of the most complex and costly components of a PCM system using per-line codecs, such standardization of the DAC for both the encoding and the decoding processes is highly desirable.

Even more desirable from the standpoint of economy and circuit simplification would be the use of a single DAC for both encoding and decoding in each line. However, upon closer examination of such multiple use of a DAC in a codec, one encounters a dilemma. Regardless of whether companding is used or not, the decision levels during encoding and the reconstruction levels during decoding do not coincide. As a matter of fact, in order to achieve minimum overall signal degradation in an end-to-end connection, the reconstruction levels during decoding should be exactly midway between the corresponding decision levels during encoding. Thus, it has previously been considered necessary to use separate DAC's for encoding and decoding, or else to add complexity to the DAC so that its transfer characteristic can be modified by a control signal between the encode and decode modes.

SUMMARY OF THE INVENTION

My invention offers a simple solution to the above dilemma so that the same DAC can be used for both encoding and decoding without the necessity of adding circuit complexity to the DAC. The basic principle, according to the invention, is to generate two samples, i.e., analog signal levels, in the decoding for each received PCM word, in contrast to the normal procedure of generating only one sample for each PCM word.

In conventional PCM systems, the analog signal waveform to be transmitted as PCM signals is sampled at an 8 khz quantized and then encoded into PCM words at a rate of 8 KHz, i.e., at 125 μs intervals. The transmitted PCM words are received at an 8 khz rate. Each received PCM word is decoded by generating a single analog signal sample. The analog signal samples which also occur at an 8 khz rate are filtered to reconstruct an analog output. One aspect of my invention, during decoding, samples are generated at twice this rate, i.e., at 16 KHz, preferably at 62.5 μs intervals. The first of the two samples per received PCM word is generated by setting the DAC to the decision level corresponding to the quantization level represented by the received PCM word. This decision level corresponds to the nearest decision level above the desired reconstruction level. The second sample is generated by modifying the received PCM word to represent a decision level below the desired reconstruction level and by setting the DAC to the nearest decision level below the desired reconstruction level. The second sample is then applied to the output of the codec 62.5 μs later, assuming an 8 KHz basic sampling rate in the system. Of course, the order of the samples may be reversed, i.e., the lower amplitude sample may be generated first and the higher amplitude sample may be generated 62.5 μs later. The choice is a matter of practical implementation. Since the two samples differ by only one least significant bit (LSB) in the PCM word used for setting the DAC, it takes only the quantization level, which is represented by the simple additional digital circuitry in the control logic for the DAC to modify the incoming PCM word. Included in the modification of the control logic necessary to implement the invention are also timing arrangements to generate two samples, equally separated, per basic decoding interval, rather than one sample. With modern large-scale-integration (LSI) technology developed by the semiconductor industry, such modifications or additions of circuitry can still be made at much lower cost than the cost of providing separate DAC's for encoding and decoding or the cost of modifying a single DAC to provide different levels during encoding and decoding.

The result of providing two samples during a basic sampling interval, e.g., an interval of 125 μs, is that the analog signal value generated received during the interval will lie midway between the two generated signal levels. This is exactly what is desired in order to arrive at the proper reconstruction level. A conventional filter that receives the decoded output signal can then provide at its output the proper average signal corresponding to the desired reconstruction level.

Two such samples, differing in amplitude by a quantization level represented by the LSB of a PCM word LSB and generated at twice the conventional sampling rate, may be regarded as amplitude modulation signals of square waveform having a basic modulation frequency equal to the conventional sampling rate, e.g., 8 KHz. In such a square waveform, there will also be unwanted odd harmonics but since their amplitudes are much lower than the amplitude of the fundamental, they can be adequately attenuated by any filter that is suitable for conventional types of PCM decoders. It can readily be shown, for example, that they may be adequately attenuated by a low-pass filter having a high rejection of 4 KHz and higher frequencies in a communication system conventionally having signal frequencies lying in the 300-3400 KHz band. Furthermore, the degree of modulation at harmonic frequencies is very low for all signal levels of concern, i.e., for signal levels higher than approximately 40 dB below maximum signal level.

DESCRIPTION OF THE PREFERRED EMBODIMENTS

Figure 1:
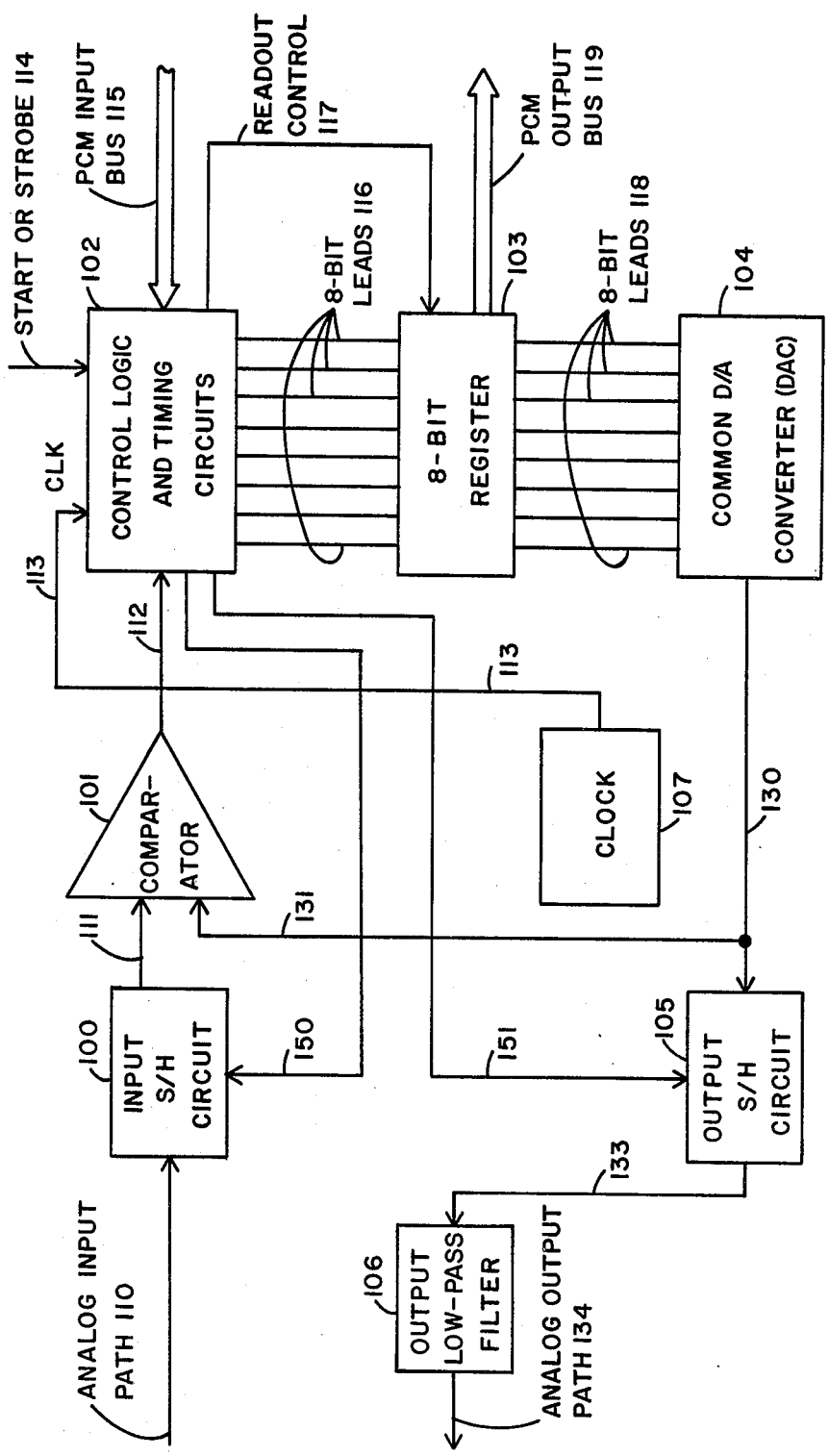
FIG. 1 is a simplified schematic diagram illustrating one form of codec using a common DAC for encoding and decoding a PCM signal in accordance with my invention.

In the codec represented schematically in FIG. 1, one-line connections have been shown between major components to simplify the drawing. It will be apparent to those skilled in the art that each line may represent several conductors or control paths. The major components of this version of my improved codec comprise an Input Sample-and-Hold Circuit (Input S/H Circuit) 100, a Comparator 101, Control Logic and Timing Circuits 102, and 8-bit Register 103, a common Digital-to-Analog Converter (DAC) 104, an Output Sample-and-Hold Circuit (Output S/H Circuit) 105, an Output Low-Pass Filter 106 and a Clock 107.

Analog signals to be encoded are supplied over Input Path 110 and the sampled signal level to be encoded is supplied over a path 111 to Comparator 101. The Control Logic and Timing Circuits 102, which receive the output of Comparator 101 over a path 112, are controlled by clock pulses over a path 113 and by conventional Start or Strobe pulses from suitable circuits (not shown) over a path 114. Input PCM signals are also supplied over a Bus 115. The outputs of the Control Logic and Timing Circuits 102 comprise the 8-bit leads 116 to the 8-bit register 103 and a Read-Out Control path 117. Outputs from the 8-bit Register 103 comprise the 8-bit Leads 118 interconnecting it with the common DAC 104. The PCM Output Bus is represented conventionally by reference numeral 119. An output path 130 from the DAC 104 supplies signals both to Comparator 101 over path 131 and to Output S/H Circuit 105 over a path 132. Finally, the decoded analog output signals are supplied over a path 133 and through Low-Pass Filter 106 to the Output Path 134. Sample-and-Hold circuits 100 and 105 are also controlled from the Control Logic and Timing Circuit 102, as indicated schematically by control paths 150 and 151, respectively.

The procedure for encoding in the system of FIG. 1 will now be briefly described. Assume that an 8 KHz sampling rate is used so that the basic sampling cycle occupies a time interval of 125 $\mu$s. The input analog signal on path 110 is then sampled by Input S/H Circuit 100 at the beginning of each sampling cycle and is held there for the balance of the 125-$\mu$s interval. This analog signal level, supplied over path 111, is compared in Comparator 101 with the analog output on paths 130-131 from the DAC 104. The output of Comparator 101 on path 112 causes the Control Logic and Timing Circuits 102 to vary the output from the 8-bit Register 103 in a direction tending to make the analog output from DAC 104 match the analog input signal from the Input S/H circuit 100.

For this matching process, many alternative strategies or algorithms may be used. The most efficient, from the standpoint of speed of response, is to approach the final value by conventional successive approximation techniques. Regardless of the method used, final result of the manipulations of the bits controlling DAC 104 should be a setting (i.e., a PCM word) which corresponds to an analog output on paths 130-131 which differs from the sampled input signal on path 111 by less than 1 step, corresponding to one least significant bit (LSB), from the output of 8-bit Register 103. Stated another way, the output from Comparator 101 on path 112 should change in response to a change in the LSB only.

A logic signal level supplied over path 150 determines whether the Input S/H Circuit 110 is tracking the analog input signal (i.e. sampling this signal) or whether it is holding the value of this input signal as it existed at the start of the holding interval. The Output S/H Circuit 105 is similarly controlled by a logic signal level over path 151.

With conventional D2/D3 PCM format used in the United States, each PCM word includes a sign bit and magnitude bits. The magnitude bits are the logic complements of a conventional binary word which expresses the amplitude of the sampled level on an approximately logarithmic basis. In accordance with this complementary representation, a decrease in the sampled level results in a corresponding increase in the magnitude portion of the PCM word.

The contents of the 8-bit Register 103 are used as the magnitude portion of an outgoing PCM word and are transmitted together with a sign bit over the PCM output bus 119 as representing the encoded signal. Hence, when the content of the 8-bit Register 103 is such that a difference of only one LSB will change the logic output of the Comparator 101, it represents the desired PCM word which is now taken out on the Output Bus 119 at a time determined by the Control Logic and Timing Circuits 102. It will be appreciated by those skilled in the art that this word can be transmitted in either parallel or serial form, as the particular application dictates.

The frequencies supplied by the Clock 107 and the parameters of the Control Logic and Timing Circuits 102 must be so chosen that the complete encoding operation will be completed during a first portion of the 125-$\mu$s cycle such that the remaining time in the cycle will be sufficient for the circuit to perform the decoding operation by use of the common DAC 104.

The decoding process in the system of FIG. 1 requires considerably less time than the encoding process. In principle, decoding only requires that the incoming PCM code on the Input Bus 115 be applied to the common DAC 104 through the 8-bit Register and that thereafter the Output S/H Circuit 105 be switched to "sample" for a time period within the 125-$\mu$s interval such that the analog output signal on path 130 can be acquired and stored. The Output S/H Circuit 105 may thereafter be switched to "hold", freeing DAC 104 for a subsequent encoding operation.

According to a preferred form of my invention, decoding is executed in two similar steps at 62.5-μs intervals. This means that the encoding must take place within one of the two 62.5-μs intervals or that it must be interrupted during the second decode sampling. The latter method makes the control logic and timing circuitry somewhat more complex but it has the advantage that more total time is available for encoding. This in turn improves the accuracy and imposes less stringent speed requirements on Comparator 101 or common DAC 104, or both. This preferred embodiment is illustrated in the schematic block diagram shown in FIG. 2. In analyzing the operation of this embodiment, reference will also be made to the timing diagrams of FIG. 3.

Figure 2:
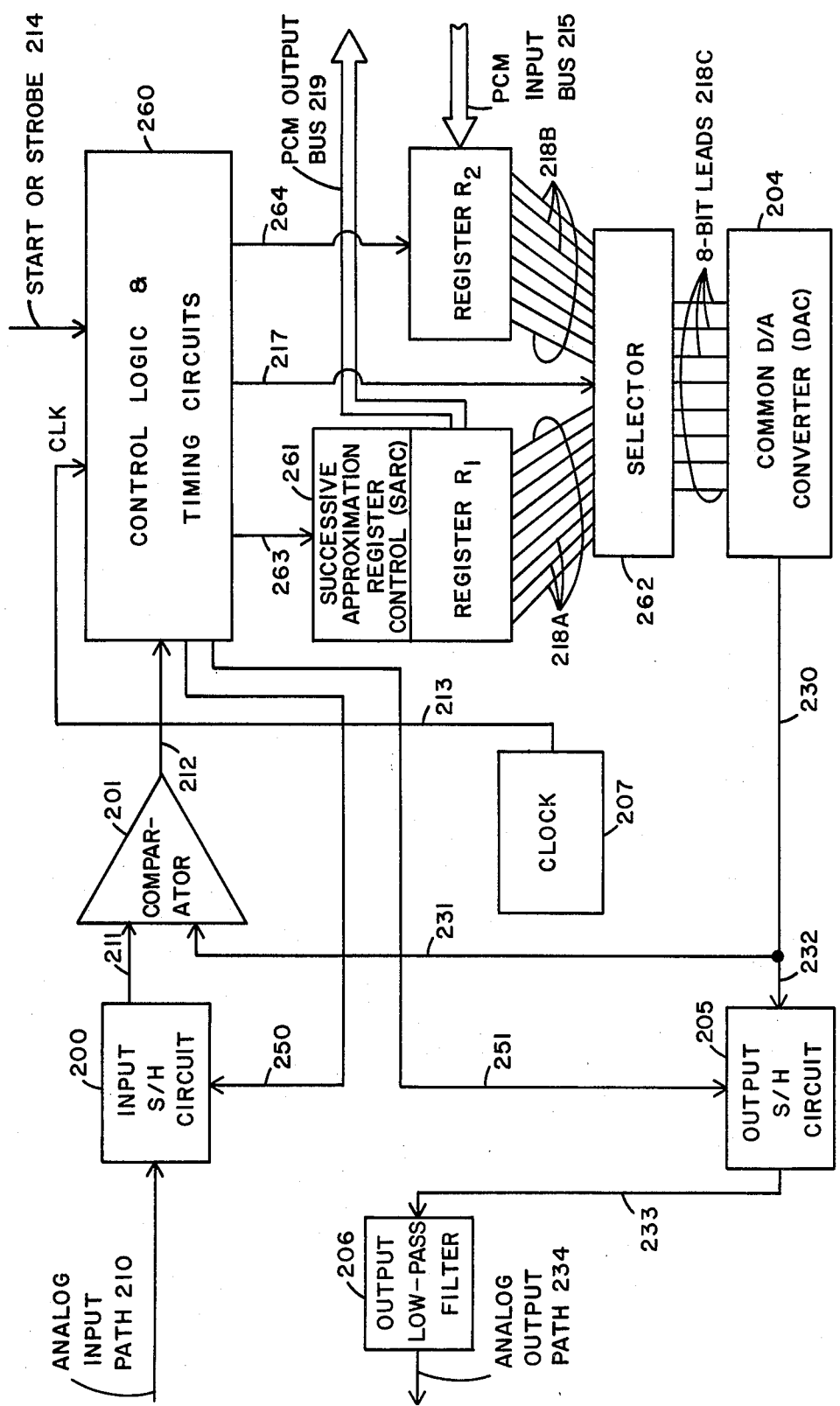
FIG. 2 is another similar schematic diagram illustrating a modified form of codec with a common DAC embodying the invention.

Referring now to FIG. 2, many of the components may be essentially the same as components in the circuit of FIG. 1 and will therefore not be described again in detail. Such similar components include the Analog Input Path 210, Input S/H Circuit 200, Comparator 201, common Digital-to-Analog Converter (DAC) 204, Output S/H Circuit 205, Output Low-Pass Filter 206, and Clock 207. Various other input signal paths also correspond to those of FIG. 1 and will not be described in detail: for example, paths 210 and 211. Various control paths also correspond to those of FIG. 1, such as the Start or Strobe path 214, logic control path 250 to the Input S/H Circuit 200 and logic control path 251 to the Output S/H Circuit 205, as well as clock pulses supplied over path 213. Similarly, many of the output paths correspond to those of FIG. 1 including paths 230-231, 232, 233, and 234. The principal differences, as compared to similar elements of FIG. 1, are that the Control Logic and Timing Circuits 102 and 8-bit Register 103 of FIG. 1 have now been replaced by master Control Logic and Timing Circuits 260, a Successive Approximation Register Control circuit (SARC) 261, including an associated Register $R_1$ which provides the PCM output over Output Bus 219, a separate Register $R_2$ which receives the PCM input over Input Bus 215 and a common Selector 262 receiving inputs from Registers $R_1$ and $R_2$ over 8-bit leads 218A and 218B, respectively. Finally, Selector 262 is interconnected with the common DAC 204 by a set of 8-bit leads 218C.

In order to simplify the schematic diagram of FIG. 2, only one control path 263 is shown between the Control Logic and Timing Circuits 260 and the SARC 261. Likewise, only one control path 264 is shown between the Control Logic and Timing Circuits 260 and the Register $R_2$. In actual practice, several paths will be required for each indicated control connection, as will be understood by those skilled in the art. For example, the control of SARC 261 and its associated Register $R_1$ will require interconnections with the Control Logic and Timing Circuit 260 to accomplish at least the following functions: (a) to read out the contents of $R_1$, either serially or in parallel, (b) to operate the SARC 261 at an appropriate secondary clock rate adequate to complete the encoding cycle in available encoding time (as will be described shortly in greater detail) and (c) to zero-set the Register $R_1$. Similarly, control of register $R_2$ requires interconnections with the Control Logic and Timing Circuits 260 to accomplish the following functions: (a) to read in a received PCM word, either serially or in parallel, during the appropriate time interval, and (b) to alter the contents of Register $R_2$ at an appropriate point of time, to be discussed below. The Selector 262 is also indicated schematically as being controlled from the Control Logic and Timing Circuits 260 over readout control path 217 so as to determine which of the two registers $R_1$ and $R_2$ is alternatively connected to the common DAC 204.

Figure 3:
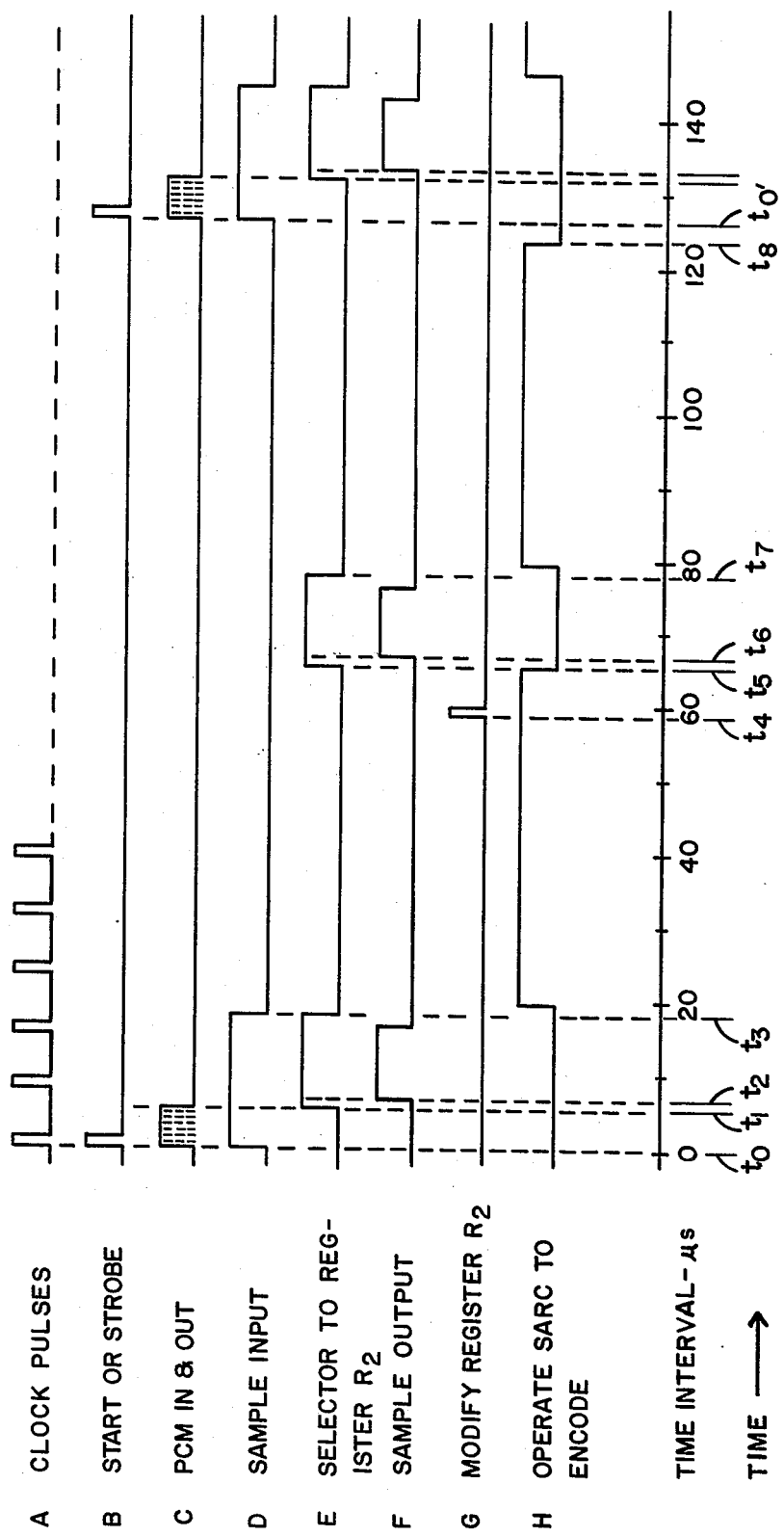
FIG. 3 is a timing diagram comprising a set of exemplary waveforms which will be particularly referred to in connection with the description of the codec of FIG. 2.

The basic encoding and decoding functions of the circuit of FIG. 2 will now be described in greater detail. In this connection, reference will also be made to the illustrative waveforms in the timing diagram of FIG. 3. As previously mentioned, it is preferred that the decoding be executed in two similar steps at 62.5-μs intervals, which means that the encoding must either be accomplished within one of the two 62.5-μs intervals or that the encoding process must be interrupted during the second decoding interval. In the illustrative embodiment shown in FIG. 2, and as shown in the waveforms of FIG. 3, a serial PCM output has been assumed with 8 bit positions, within approximately 5.2 μs intervals, corresponding to a bit rate of 1.544 Mb/s. This in turn corresponds to the basic 8 KHz sampling rate. One complete 125-μs cycle is represented during the time interval $t_0$-$t_0'$ in FIG. 3, with certain points of time, referred to below, indicated by $t_0$-$t_8$. The clock pulses (not precisely to scale) are indicated by waveform A in FIG. 3. These may, for example, recur at a frequency of 128 KHz.

On occurrence of a Start or Strobe pulse over path 214 at time $t_0$, represented by waveform B in FIG. 3, the Control Logic and Timing Circuits 260 activate the Register $R_1$ through the SARC 261 and control path 263. At the same time, the Register $R_2$ is enabled over control path 264x to receive the PCM input signal on Input Bus 215. During the first 5.2 μs (approximately), the PCM word residing in register $R_1$, as a result of encoding an analog input sample during the preceding 125-μs cycle, is read out to the PCM Output Bus 219. Simultaneously, a new incoming PCM word is read into register $R_2$ from the PCM Input Bus 215. These operations are represented by the waveform C in FIG. 3. Within the time period $t_0$-$t_3$, as represented by waveform D, the Input S/H Circuit 200 is set into its "sample" mode to accept a new input analog sample from input path 210. This sampling period is not critical and may for example be of the order of 15μs or more, as this sample cannot be used before the common DAC 204 is again available. This relatively long sampling time helps to improve the precision of the sample and to reduce the speed requirements on the Input S/H Circuit 200.

At time $t_1$, immediately after reception of the input PCM word, the Selector 262 is set to receive signals from the Register $R_2$ so that its content defines the analog output from the DAC 204. This is represented by waveform E. After a short time, $t_1$-$t_2$, to allow DAC 204 to settle, the Output S/H Circuit 205 is set to its "sample" mode so that it acquires the analog signal from DAC 204. This is represented within the interval $t_2$-$t_3$ by waveform F. The sampling time must be determined from the acquisition time of the DAC 204 and by the required accuracy. A time interval $t_2$-$t_3$ of the order of 10 μs may be adequate in a practical system.

After completion of the output sampling interval within $t_2$-$t_3$, the Output S/H Circuit 205 is set to its "hold" mode and the Selector 262 is set to receive the 8-bit signals from Register $R_1$. This then prepares the codec for the encoding process which will be initiated just after time $t_3$, by control of the SARC 261 from the Control Logic and Timing Circuits 260 over path 263. The encoding intervals are represented by waveform H. For this first encoding interval within $t_3$-$t_5$, according to the assumptions made above, a time frame of the order of 40–45 μs is available before it is again interrupted at time $t_5$. Then immediately thereafter, during the time interval $t_6$-$t_7$, the SARC is interrupted so that the DAC 204 may be "borrowed" within the time interval $t_6$-$t_7$ to decode the modified input PCM word in order to provide the second output sample approximately one-half frame later (e.g., at time $t_6$ which is about 65 μs from the start of a cycle). As represented in FIG. 3, the output sampling interval of waveform F is preferably terminated just before the start of the encoding interval of waveform H to allow the circuits to settle, e.g., just before and just after time $t_3$, respectively.

During this first encoding interval between $t_3$ and $t_5$, an extra reset pulse, represented by waveform G, is sent to Register $R_2$ at time $t_4$ to modify its content in accordance with the principles of my invention. If, according to the preceding descriptiond, the so-called D2/D3 code format is used, this modification will consist of adding one bit to the code word in the least significant bit (LSB) position. Of course, by logic addition, this may also result in a change of the "higher order" bits in the code word. For example, there is one special case where the original unmodified code word has 1's in all magnitude - bit positions. In this case, the modification should result in a change in the most significant bit (MSB) position with all seven "amplitude bits" left unchanged as 1's. This special case can easily be handled by proper digital logic techniques familiar to those skilled in the art.

The overall result of this addition should be that the absolute output level of the DAC 204 is reduced by one step size. This step size depends on the level being sampled, as determined by the position of the chord on which this sample is located. The exact point of time $t_4$ for modification of the $P_2$ is not critical, as will be evident from the timing diagram.

As previously stated, approximately, 62.5 μs after the start of the cycle, the operation of the SARC 261 is interrupted within the time interval $t_5$-$t_7$. After a suitable guard time, $t_5$-$t_6$, Selector 262 is again set to receive the 8-bit sample during interval $t_6$-$t_7$ from Register $R_2$ (per waveform E). Output S/H Circuit 205 is concurrently set to its "sample" mode within the interval $t_6$-$t_7$, as illustrated by waveform F, thereby acquiring the second analog signal level, which is one LSB lower in amplitude, from the DAC 204. As previously mentioned, the sampling time must be determined from the acquisition time of DAC 104 and by the required system accuracy. A decoding time of the order of about 10 μs may be adequate in a particular system, as previously mentioned. As only a relatively small shift in level is imposed on Output S/H Circuit 205, this second sample interval $t_6$-$t_7$ may be made shorter than the first output sample interval $t_2$-$t_3$ if total available time in the cycle becomes critical.

After restoring Output S/H Circuit 205 to "hold" condition and resetting Selector 262 to receive pulses from Register $R_1$, the encoding process may be resumed, as previously described, by operation of SARC 261. Accordingly, an additional encoding time of the order of about 40 μs is now available for encoding from time $t_7$ up to the time $t_8$ near the end of the sampling cycle.

The interrupt arrangement just described provides almost twice the total time for encoding as compared to the system of FIG. 1 (e.g., within time interval $t_3$-$t_5$ plus time interval $t_7$-$t_8$.). This is a significant advantage as the speed requirements for the encoding circuits can thereby be reduced to a minimum.

While I have described certain preferred features and embodiments of my invention with reference to the encoding and decoding laws and speeds typically used in the United States, it will be apparent to those skilled in the art that the basic principles are generally applicable to systems having other types of encoding and decoding laws and speeds, such as the European CCITT telecommunications systems with companding according to the A-law. For a general discussion of industry standards applicable to digital transmission systems and recommendations for encoding and decoding, reference may be made to the so-called "Green Book" of the CCITT, reporting on the "Fifth Plenary Assembly", Geneva, 4-15 December 1972, Vol. III-2, Section 7 (and especially pages 372–377), published by the International Telecommunication Union, 1973. My invention is also applicable to systems with other sampling frequencies and other channel sizes (numbers of channels). The specific timing arrangements shown for purposes of illustration may also be modified, if desired, e.g., for plesiochronous operation, where the encode and decode operations are not in full synchronism. The invention may also be used in PCM systems which employ linear encoding, rather than companded encoding, although in the latter case the advantages obtained by use of my invention may be less outstanding.

While I have disclosed certain specific embodiments of my invention, it will be understood that these are purely exemplary and that I intend to be limited only by the scope and spirit of the appended claims.

I claim:

1. In a communication coding and decoding system for encoding an incoming analog signal into an outgoing PCM signal and also decoding an incoming PCM signal into an outgoing analog signal, all within a selected time period corresponding to one cycle at a basic sampling frequency, the combination comprising:
    means for receiving said incoming PCM signal within said time period;
    decoding means comprising a common digital-to-analog converter (DAC) and control means for setting said DAC in accordance with said received PCM signal to a first decision level adjacent to one side of a desired analog reconstruction level within a first predetermined portion of said time period;
    means for modifying said received PCM signal; said control means utilizing said modified PCM signal for resetting said DAC to a second decision level adjacent to the opposite side of said reconstruction level within a second predetermined portion of said time period;
    encoding means comprising said common DAC for encoding said incoming analog signal into an outgoing PCM signal during a third predetermined portion of said time period;
    means for sequentially reading out resultant analog signal levels from said DAC corresponding to said first and second decisions levels; and
    means for averaging said resultant analog signal levels to provide an outgoing analog signal having a value intermediate said decision levels.

2. A system according to claim 1 further comprising timing means for initiating said first and second portions of said time period at twice said basic sampling frequency, the second portion beginning substantially at the midpoint of said time period; and whereby said output reconstruction level lies midway between said decision levels.

3. A system according to claim 2 wherein:
said encoding means further comprises a first digital register for storing each said outgoing PCM signal;
said decoding means further comprises a second digital register for storing said incoming PCM signal; and said system further comprises
selector means controlled by said control means for alternately gating said first and second registers to said common DAC during the encoding and decoding portions of said time period.

4. Apparatus for encoding an incoming analog signal into an outgoing digital signal representation and for decoding an incoming digital signal representation into an outgoing analog signal, all within a selected time period corresponding to one cycle at a basic sampling frequency, said apparatus comprising:
means for receiving said coded digital representation;
means for decoding said received coded digital signal representation into one analog signal level during a first predetermined portion of said time period;
means for modifying said received digital signal representation;
means for receiving said incoming analog signal;
means for encoding said received incoming analog signal into an outgoing digital signal representation during a further predetermined portion of said time period;
means for interrupting the operation of said encoding means during another predetermined portion of said time period;
means for decoding said modified digital signal representation into a second analog signal level during said third predetermined time period.

5. Encoding and decoding apparatus in accordance with claim 4 wherein said first analog signal level is offset in one direction from a desired reconstruction level and said second analog signal is offset in another direction from said desired reconstruction level.

6. Encoding and decoding apparatus in accordance with claim 4, wherein said further predetermined portion includes one or more time intervals interspersed with said one and another predetermined portions.

7. Encoding and decoding apparatus in accordance with claims 4 or 5, further comprising means for averaging said first and second analog signal levels to produce said outgoing analog signal.

8. In a communication coding and decoding system for encoding an incoming analog signal into outgoing PCM signals and also decoding incoming PCM signals into an outgoing analog signal, all within a selected time period corresponding to one cycle at a basic sampling frequency, the combination comprising:
encoding means comprising a common digital-to-analog converter (DAC) for encoding said incoming analog signal into an outgoing PCM signal during a predetermined portion of said time period;
means for receiving an incoming PCM signal during said time period;
decoding means comprising said DAC and control means for setting said DAC in accordance with said incoming PCM signals to a first decision level adjacent to one side of a desired analog reconstruction level in accordance with said received PCM signal during a first portion of said time period;
means for modifying said received incoming PCM signals;

means for interrupting said encoding operation during a second predetermined portion of said time period;
means for utilizing said modified PCM signal to reset said DAC to a second decision level adjacent to the opposite side of said reconstruction level during said second predetermined portion;
means for sequentially reading out resultant analog signal levels from said DAC corresponding to said first and second decision levels; and
means for averaging said resultant signals to provide a decoded analog signal having a value intermediate said decision levels.

9. A system in accordance with claim 8, further comprising:
timing means for initiating said first and second predetermined portions of said time interval at twice the basic sampling frequency; said second predetermined portion beginning substantially at the midpoint of said time period; and
wherein said output reconstruction level lies midway between said decision levels.

10. A system in accordance with claim 9, wherein:
said encoding means further comprises a first digital register for storing said outgoing PCM signal;
said decoding means further comprises a second digital register for storing said incoming PCM signal; and
said system comprises selector means controlled by said control means for alternately gating said registers to said common DAC during the encoding and decoding portions of said time period.

11. Apparatus for encoding an incoming analog signal into an outgoing digital signal representation and for decoding an incoming digital signal representation into an outgoing analog signal, all within a selected time period corresponding to one cycle at a basic sampling frequency, said apparatus comprising:
means for receiving said incoming digital signal representation;
means for decoding said received digital signal representation into a first analog signal level during a first predetermined portion of said time period;
means for modifying said digital signal representation;
means for decoding said modified digital signal representation into a second analog signal level during a second predetermined portion of said time period;
means for receiving said incoming analog signal; and
means for encoding said incoming analog signal into an outgoing digital signal representation during a third predetermined portion of said time period.

12. Encoding and decoding apparatus in accordance with claim 11, wherein said first analog signal level is offset in one direction from a desired reconstruction level and said second analog signal is offset in another direction from said desired reconstruction level.

13. Encoding and decoding apparatus in accordance with claim 11, wherein said third predetermined portion includes one or more time intervals interspersed with said first and second predetermined portions.

14. Encoding and decoding apparatus in accordance with claim 12, further comprising means for averaging said first and second analog signal levels to produce said outgoing analog signal.

15. A method for decoding incoming digital signal representations of an analog signal and for encoding an incoming analog signal into outgoing digital signal representations comprising the steps of:
- (a) receiving an incoming digital signal representation during a time interval corresponding to one cycle at a basic sampling frequency;
- (b) receiving an incoming analog signal during said time interval;
- (c) storing said received digital signal representation;
- (d) decoding said stored digital signal representation into a first analog signal level during one predetermined portion of said time period;
- (e) modifying said stored digital signal representation;
- (f) encoding said received incoming analog signal into an outgoing digital signal representaton during a further predetermined portion of said time interval;
- (g) interrupting said encoding step for a another predetermined portion of said time interval; and
- (h) decoding said modified digital signal representation into a second analog signal level during said another predetermined portion of said time interval.

16. A method in accordance with claim 15 comprising the further step of averaging said first and second analog levels during said time interval to generate an outgoing analog signal.

17. A method for decoding incoming digital signal representations of analog signals and for encoding incoming analog signals into outgoing digital signal representations comprising the steps of:
- (a) receiving a digital signal representation during a first predetermined portion of a selected time interval corresponding to one cycle at a basic sampling frequency;
- (b) storing said received digital signal representation during said first predetermined portion;
- (c) decoding said stored digital signal representation into a first analog signal level during said first predetermined portion;
- (d) modifying said stored digital signal representation;
- (e) decoding said modified digital signal representation into a second analog signal level during a second predetermined portion of said time interval;
- (f) receiving an incoming analog signal during said time interval; and
- (g) encoding said received incoming signal into an outgoing digital signal representation during a third predetermined portion of said time interval.

18. A method in accordance with claim 17, wherein said third predetermined portion includes one or more time intervals of said selected time interval interspersed with said first and second predetermined portions.

* * * * *